(12) United States Patent
He et al.

(10) Patent No.: US 6,873,029 B2
(45) Date of Patent: Mar. 29, 2005

(54) SELF-ALIGNED BIPOLAR TRANSISTOR

(75) Inventors: Gang He, Camarillo, CA (US); James Howard, Camarillo, CA (US)

(73) Assignee: Vitesse Semiconductor Corporation, Camarillo, CA (US)

(*) Notice: Subject to any disclaimer, the term of this patent is extended or adjusted under 35 U.S.C. 154(b) by 0 days.

(21) Appl. No.: 10/364,075

(22) Filed: Feb. 10, 2003

(65) Prior Publication Data

US 2004/0155262 A1 Aug. 12, 2004

(51) Int. Cl.[7] .................... H01L 27/082; H01L 21/331
(52) U.S. Cl. .................... 257/586; 257/584; 257/587; 257/588; 257/592; 438/309; 438/312; 438/317
(58) Field of Search ................... 257/197–198, 257/573, 584, 586, 587, 592, 614, 615; 438/235, 309, 312, 317

(56) References Cited

U.S. PATENT DOCUMENTS

| | | | |
|---|---|---|---|
| 5,159,423 A | | 10/1992 | Clark et al. |
| 5,525,833 A | * | 6/1996 | Jang .................... 257/587 |
| 5,946,582 A | | 8/1999 | Bhat |
| 6,225,181 B1 | | 5/2001 | Gregory |
| 6,239,477 B1 | | 5/2001 | Johnson |
| 6,285,044 B1 | | 9/2001 | Bhat |
| 6,337,494 B1 | | 1/2002 | Ryum et al. |
| 6,399,971 B1 | * | 6/2002 | Shigematsu et al. ........ 257/197 |

* cited by examiner

Primary Examiner—Donghee Kang
(74) Attorney, Agent, or Firm—Christie, Parker & Hale, LLP

(57) ABSTRACT

A heterojunction bipolar transistor with self-aligned features having a self-aligned dielectric sidewall spacer disposed between base contact and emitter contact, and self-aligned base mesa aligned relative to self-aligned base contact. The base contact is self-aligned relative to the self-aligned dielectric sidewall spacer providing a predetermined base-to-emitter spacing thereby. The emitter may be an n-type, InP material; the base can be a p-type InGaAs material, possibly carbon-doped. The fabrication method includes forming a emitter electrode on an emitter layer; using the emitter contact as a mask, anisotropically etching the emitter exposing the base layer; forming a self-aligned dielectric sidewall spacer upon the emitter and base; self-alignedly depositing a self-aligned base electrode; using the self-aligned base electrode as a mask, anisotropically etching the base layer to expose the subcollector; and depositing a collector electrode on the subcollector layer.

19 Claims, 6 Drawing Sheets

SELF-ALIGNED BIPOLAR TRANSISTOR

BACKGROUND OF THE INVENTION

The present invention relates generally to a semiconductor devices, and more particularly to a self-aligned bipolar transistor (BJT).

A bipolar transistor, sometimes simply referred to as a bipolar transistor or a BJT, is a circuit element in an integrated circuits due to its high speed switching capability and current carrying capacity. A bipolar transistor uses holes and electrons to conduct electrical current.

The bipolar transistor has an emitter, a collector, and a base interposed between the emitter and the collector. Typically, the emitter and collector are of one conductivity type of semiconductor, while the base is of an opposite type, thereby forming two pn junctions. Modulating the current injected into the base terminal of a bipolar transistor will modulate the current flowing through the pn junctions of the base from the emitter to the collector.

BJT fabrication methods have attempted to reduce BJT dimensions and increase the ease and reliability of manufacture. Directional deposition and layer undercutting are two of the many techniques employed in the existing art, to reduce BJT dimensions and self-align HBT structures. Such techniques, however, tend to be process-sensitive and difficult to control, so that the yield, reliability, performance, and production costs associated with devices thus fabricated also are difficult to control.

SUMMARY OF THE INVENTION

The present invention provides a heterojunction bipolar transistor having self-aligned features, and a method for fabricating the same. In one aspect, a semiconductor structure has a collector, a base, and an emitter, operably coupled as a bipolar junction transistor; a dielectric sidewall spacer self-alignedly disposed on the emitter; a base contact self-alignedly disposed upon the dielectric sidewall spacer and electrically coupled with the base; and a base mesa self-aligned relative to the base contact.

In another aspect, the structure collector, emitter, and base are comprised of materials from the Group III–V compound semiconductor materials. The semiconductor structure can form a heterojunction bipolar transistor having an InP/InGaAs heterojunction, for example, in which the base is a InGaAs material and the emitter is an InP material. In yet another aspect of the invention, the base can be carbon-doped.

In still another aspect of the invention, a heterojunction bipolar transistor includes a dielectric sidewall spacer self-alignedly disposed on a wall of an emitter; a base contact self-aligned relative to the dielectric sidewall spacer, the dielectric sidewall spacer providing a self-aligned base-to-emitter spacing; and a base mesa self-aligned relative to the base contact.

A further aspect of the invention can provide a heterojunction bipolar transistor, having a collector; a collector contact electrically coupled with the collector; an emitter being a Group III–V semiconductor material of a first conductivity type; an emitter contact electrically coupled with the emitter; a base electrically coupled with the collector and the emitter, and being a Group III–V semiconductor material of a second conductivity type; a base contact electrically coupled with the base; a self-aligned dielectric sidewall spacer disposed between the base contact and the emitter, wherein the base contact is self-aligned relative to the self-aligned dielectric sidewall spacer and a predetermined base-to-emitter spacing is provided thereby; and a self-aligned base mesa which is aligned relative to the self-aligned base contact. In this aspect of the invention the base can be a p-type InGaAs material and the emitter an n-type InP material; conversely, the base can be an n-type material and the emitter a p-type material.

In aspects of the invention, the invention also provides a method for fabricating the heterojunction bipolar transistor which is formed upon a substrate sequentially having a subcollector layer, a collector layer, a base layer, and an emitter layer formed thereupon, which method includes forming an emitter electrode on the emitter layer; etching the emitter layer by an anisotropic etching process to expose the base layer, using the emitter electrode to form an emitter mesa thereby; forming a self-aligned dielectric sidewall spacer horizontally upon the base layer and vertically upon the emitter mesa; self-alignedly depositing a self-aligned base electrode horizontally on the base and vertically on a portion of the self-aligned dielectric sidewall spacer; etching the base layer by an anisotropic etching process to expose the subcollector layer, using the self-aligned base electrode as a mask and forming self-aligned base mesa thereby; depositing a collector electrode on the subcollector layer; and introducing electrical discontinuities into the subcollector layer in a region surrounding the heterojunction bipolar transistor.

In another aspect of the fabrication method, the material constituting the emitter electrode differs from material constituting the base electrode; or the material constituting the emitter electrode differs from material constituting the collector electrode; or both. In yet another aspect of the fabrication method of the present invention, the heterojunction bipolar transistor thus formed includes a base, which is a p-type or a $p^+$-type InGaAs material, between about 200 and about 1200 Angstroms thick, and doped to a concentration of between about $2 \times 10^{19}$ $cm^{-3}$ and about $8 \times 19^{19}$ $cm^{-3}$; and an emitter, which is an n-type InP material between about 500 and about 3000 Angstroms thick doped to a concentration of between about $2 \times 10^{19}$ $cm^{-3}$ and about $8 \times 19^{19}$ $cm^{-3}$. The base can be doped with carbon.

A further aspect of the fabrication method herein includes selectively etching the subcollector layer in a transistor mesa region surrounding the transistor and exposing the substrate, producing electrical discontinuity between the transistor mesa region and an adjacent transistor mesa region.

A further aspect of the invention provides a transistor comprising a collector, a base overlaying at least a portion of the collector, an emitter overlaying at least a portion of the base, and a base metal contact pad overlaying at least part of a portion of the emitter, the base metal contact pad electrically coupled to the base by a base contact sidewall.

BRIEF DESCRIPTION OF THE DRAWINGS

These and other features, aspects and advantages of the present invention will be more fully understood when considered with respect to the following detailed description, appended claims and accompanying drawings, wherein:

DETAILED DESCRIPTION

The semiconductor structure of the present invention can include a heterojunction bipolar transistor that employs self-aligned base-to-emitter contact spacing, a self-aligned base contact width, and a self-aligned base mesa area.

In general, the emitter and base electrodes are formed separately, so that each electrode may be made of combinations of various electrode materials. More particularly, p- and n-type electrode materials can be used for the base and emitter electrodes, respectively, thereby obtaining electrodes having excellent ohmic characteristics. Also, the base and emitter electrodes can be made of the same conductive material doped with a dopant at different concentrations, further simplifying the fabrication process. The result is that the structure and method of the present invention provide heterojunction devices with reduced parasitic capacitances and resistances, which employ simplified, stable, and thus more reliable and less expensive, fabrication processes.

Figure 1A:
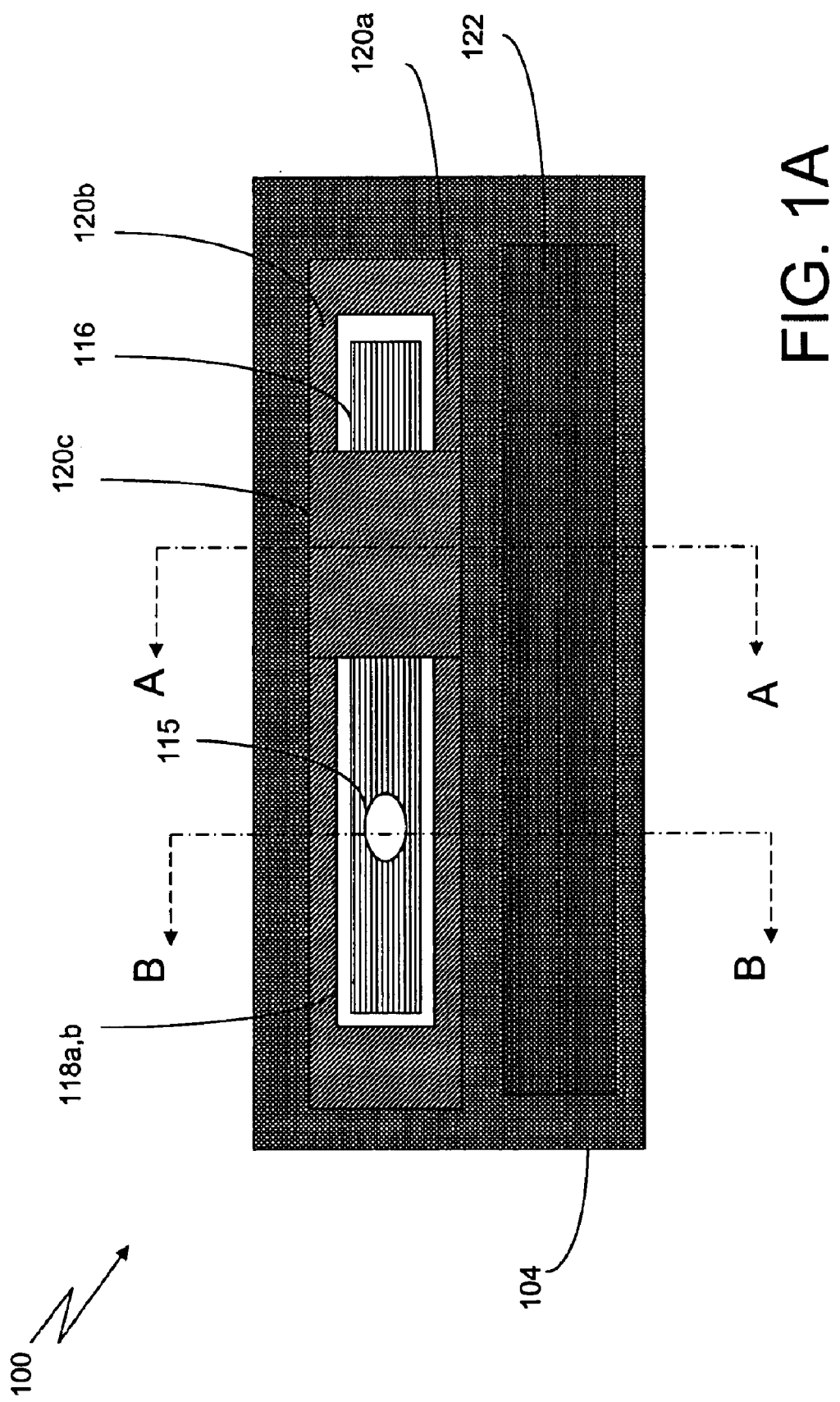
FIG. 1A is a plan view of a heterojunction bipolar transistor fabricated in accordance with the present invention.

FIG. 1A is a plan is a plan view of a transistor 100. A subcollector 104 forms surface, substantially rectangular as illustrated. The subcollector is a doped semiconductor material, with the material being either n-doped or p-doped depending on whether the transistor is an NPN transistor or a PNP transistor, respectively. The subcollector is on a substrate (shown in FIGS. 1B and 1C as 102). A collector ohmic contact 122 is on one side of the surface formed by the subcollector. The collector ohmic contact provides an interconnect for electrically contacting a collector (shown as 106 in FIGS. 1B and 1C). Alternatively, a via may be used in place of the collector ohmic contact. A mesa is on another side of the subcollector surface. Base ohmic contact spacers 120a,b are on a base (108 in FIGS. 1B and 1C), and dielectric sidewall spacers 118a,b separate the base ohmic contact spacers from an emitter mesa. The emitter mesa has an oxide layer 116, with a via extending to emitter metal 115. A base metal contact pad, or base metal strap, 120c extends across and through a portion of the sidewall spacers and emitter oxide, connecting the base ohmic contact spacers. The base metal contact pad provides an electrical contact pad for the base.

Figure 1B:
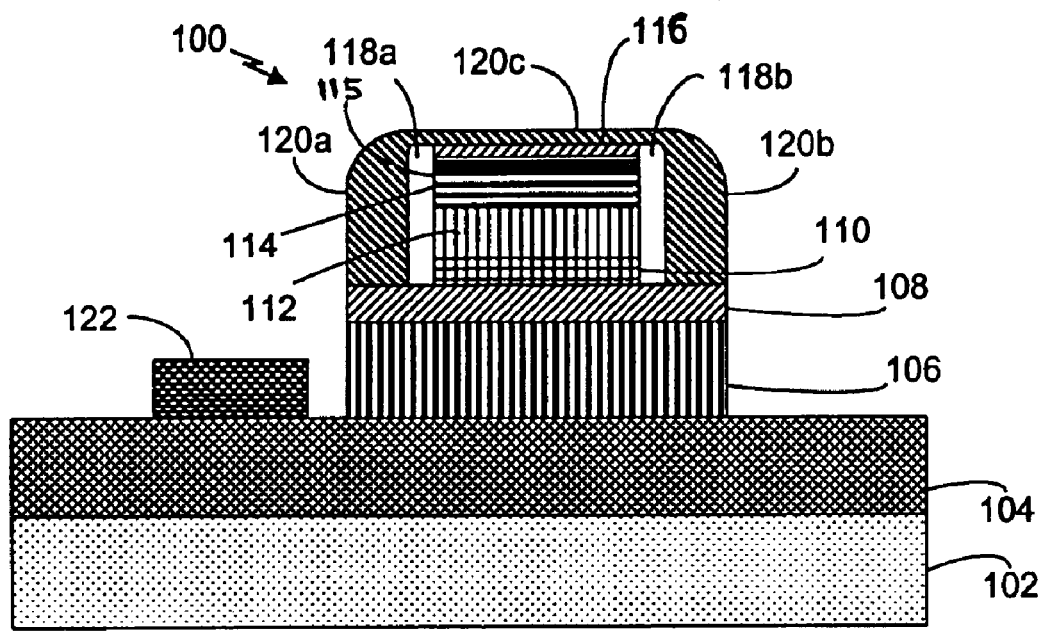
FIG. 1B is a cross-sectional view of the transistor of FIG. 1A, taken along the A—A plane.
Figure 1C:
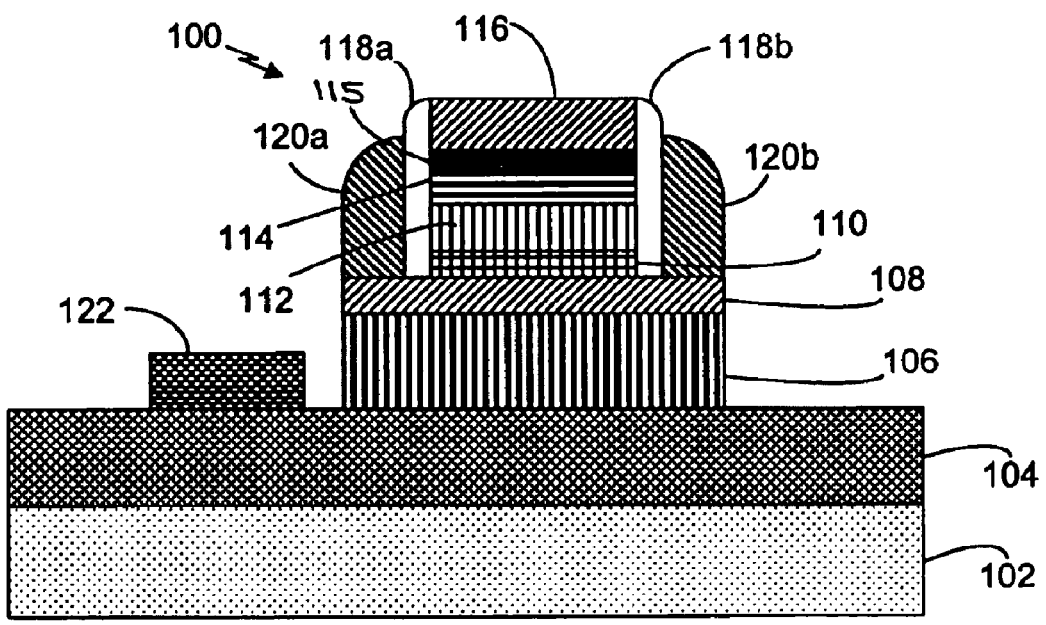
FIG. 1C is a cross-sectional view of the transistor of FIG. 1A, taken along the B—B plane.

FIG. 1B shows a cross-sectional view of transistor 100, taken along the A—A plane in FIG. 1A. FIG. 1B includes substrate 102, subcollector 104, collector 106, base 108, base-emitter transition layer 110, emitter 112, emitter cap 114, emitter metal 115 (sometimes referred to as an emitter ohmic contact), dielectric sidewall spacer 118a, 118b, base contact spacers 120a, 120b, base metal contact pad 120c, and collector ohmic contact 122. Emitter dielectric layer 116 insulates emitter metal 115 from electrical contact with base metal pad 120c. FIG. 1C shows a cross-section of transistor 100, taken along plane B—B in FIG. 1A, illustrating substrate 102, subcollector 104, collector 106, base 108, base-emitter transition layer 110, emitter 112, emitter cap 114, emitter ohmic contact 115, emitter dielectric layer 116, dielectric sidewall spacer 118a, 118b, base contact spacers 120a, 120b, and collector ohmic contact 122. In FIG. 1C, base ohmic contact 120c does not cross-over emitter cap 114, thus a via may be placed through dielectric layer 116 landing on emitter electrode 115 providing an interconnect for electrically contacting the emitter. Depending upon the device in which HBT 100 is disposed, contacts 116, 120a, 120b, 120c, 122 can be electrically coupled to other HBTs or optoelectronic components fabricated on the underlying substrate 102 using, for example, TiAu interconnect metallization, or evaporated Au air bridge metallization.

In general, process-sensitive deposition and etching techniques such as undercutting, directional shadow mask deposition, and liftoff, can lead to unacceptable variations in critical dimensions, adversely impacting yield, reliability, and fabrication costs. By contrast, the self-aligned structures of the present invention can be fabricated by mature, more controllable, deposition and etching techniques, which tends to result in improved device yield and reliability, and reduced fabrication costs.

Figure 2A:
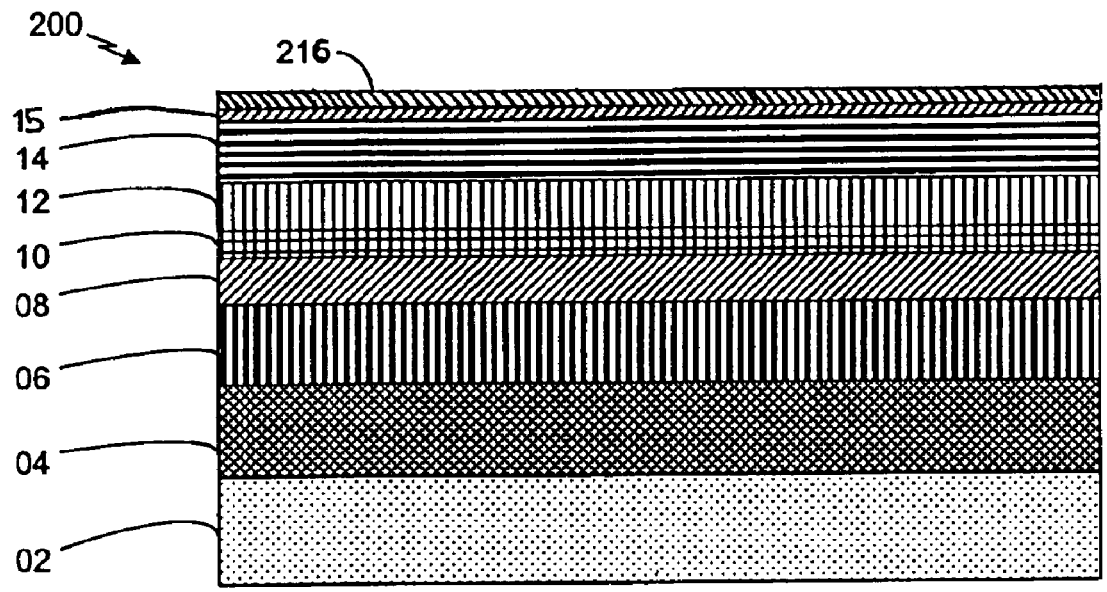
FIG. 2A is a diagrammatic cross-section of an exemplary epitaxial wafer having layers of III–V semiconductor group materials formed thereupon.

FIG. 2A is a cross-sectional diagram of an exemplary epitaxial wafer portion from which layered semiconductor structure 200 according to the present invention can be fabricated from selected Group III–V compound semiconductor group materials. Group III–V compound semiconductors consists of many binary, ternary, and quaternary compound materials, including, without limitation, such as GaAs, InP, InGaAs, InAlAs, InAlGaP, and the like. It may be desirable that the constituent material of substrate 202 be chosen from Group III–V compound semiconductor materials, for example, the semi-insulating material, indium phosphide (InP). Substrate 202 may be composed of other materials, for example, silicon, although this might necessitate the interposition of a buffer layer of InP to minimize the migration of silicon atoms into the electrically active structure 200. The chemical makeup of layers 204, 206, 208, 210, 212, 214 can be suitable materials including selected materials from the III–V compound semiconductor group, phosphides and nitrides of Group III–V materials, silicon, silicon compounds, and functional combinations thereof. In certain embodiments of the invention herein, it may be desirable that semiconductor material layers 204, 206, 208, 210, 212, 214 be least approximately lattice-matched to substrate 202, whose <100> plane is taken as a main surface. Techniques for preparing epitaxial wafers having lattice-matched layers include molecular beam epitaxial growth (MBE), metal-organic vapor phase epitaxy (MOVPE), and chemical beam epitaxy (CBE), although other lattice-matching epitaxial growth techniques known in the art also may be used. In addition, it may be desirable to deposit emitter dielectric layer 215 upon emitter metal 216 to selectively provide electrical isolation for emitter metal 215 from conductive structures which may be subsequently superimposed thereupon.

In the wafer of FIG. 2A, a subcollector layer of initially, an $n^+$-type InGaAs or InP material is deposited upon an InP substrate 202. A collector layer 206 of a- or $n^-$-type InGaAs material is deposited on the subcollector layer. A base layer 208 is deposited on the collector layer 206. The base material is a p- or p+-type, Be—, Zn—, or C-doped, InGaAs material. An emitter layer 212 of an n-type, InP material is over the base layer. Because a potential spike may exist between the base layer 208 and the emitter layer 212, it may be desirable to dispose therebetween a base-emitter gradient layer 210, undoped, or with doping graded roughly linearly from substrate to surface, in the InP or InGaAs gradient material. Without the smoothing layer 210, electrically coupling base layer 208 and emitter layer 212, the HBT emitter-base junction might require more forward bias to inject electrons from emitter to base. To achieve a low emitter contact resistance, emitter cap layer 214, of an $n^+$-type InGaAs or InP-containing material, about 200–3000 Angstroms thick, is on the emitter layer 212. An emitter metal layer 215 is deposited on the emitter cap layer. Emitter metal layer may be, for example, non-alloyed Ni/AuGe/Au, or other low-resistance materials suitable for forming an efficient electrical interface with the uppermost material of emitter cap layer 214. Emitter ohmic metal 215 is electrically coupled with emitter 212 through emitter cap 214. As would be understood by those of ordinary skill in the art, the aforementioned layers are exemplary only and may be supplemented by interposing additional layers of similar material having, for example, different doping levels, such that the electrical characteristics and parametric performance of the resultant compound structure are advantageously modified.

Furthermore, it may be desirable to deposit an emitter dielectric layer 216, such as, for example, polyimide, or even silicon nitride, silicon oxide, and the like, to provide electrical insulation to emitter metal layer 215 from conductive layers that may be subsequently superimposed thereupon. A via may be placed through the emitter dielectric layer to the emitter metal layer providing for electrical connection to the emitter. Thus, an HBT according to one aspect of the invention, can be created using prefabricated epitaxially-layered structure 200, which includes subcollector layer 204 being formed upon substrate 202, and collector layer 206 formed upon, and electrically coupled with subcollector 204. In turn, base layer 208 can be formed upon, and electrically coupled with, collector layer 206. Upon base layer 208 can be base-emitter gradient layer 210, with emitter layer 212 being formed thereupon. Gradient layer 210 is electrically coupled with emitter layer 212, which is composed of a Group III–V material of a first conductivity type, and with base layer 208, which is composed of a Group III–V material of a second conductivity type.

Figure 2B:
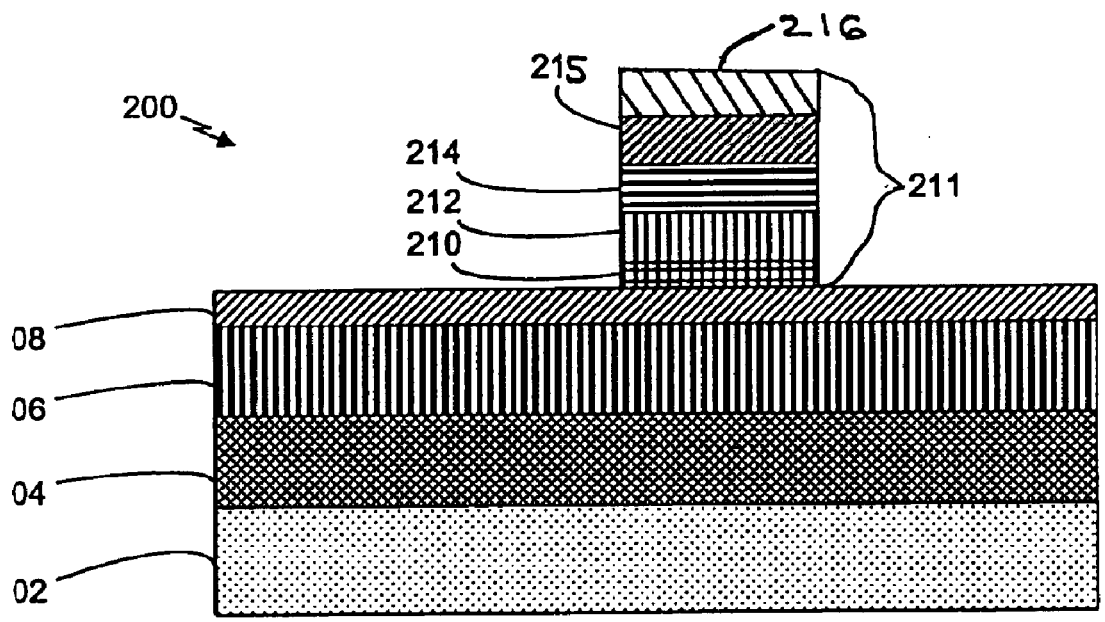
FIG. 2B is a diagrammatic cross-section of a semiconductor structure being formed upon the exemplary epitaxial wafer in FIG. 2A, showing an emitter mesa formed subsequent to etching according to a method of the present invention.
Figure 2C:
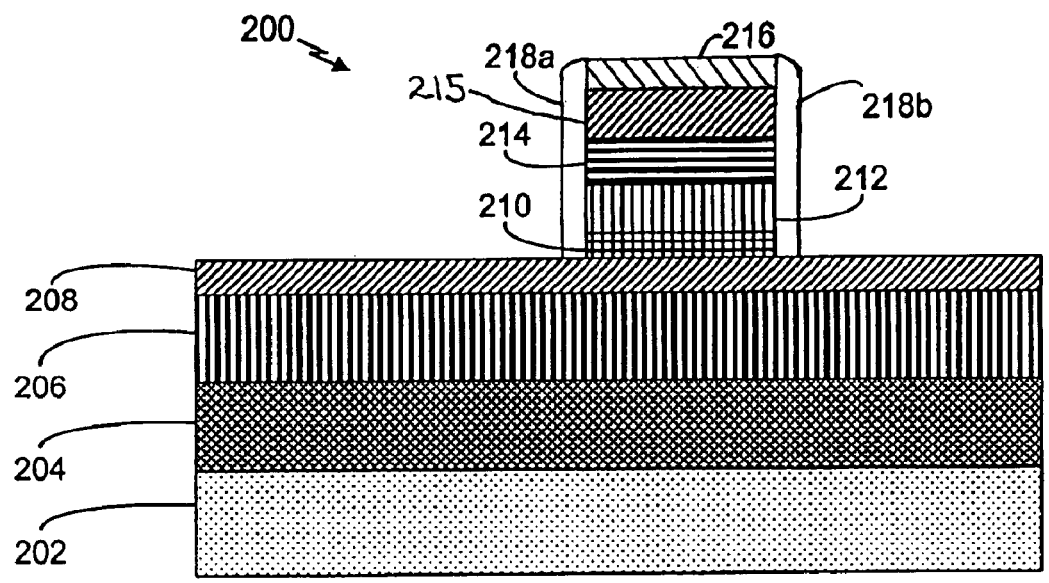
FIG. 2C is a diagrammatic cross-section of the exemplary semiconductor structure in FIG. 2B, displaying a self-aligned emitter contact and a self-aligned dielectric sidewall spacer formed on the emitter mesa according to an aspect of the present invention.
Figure 2D:
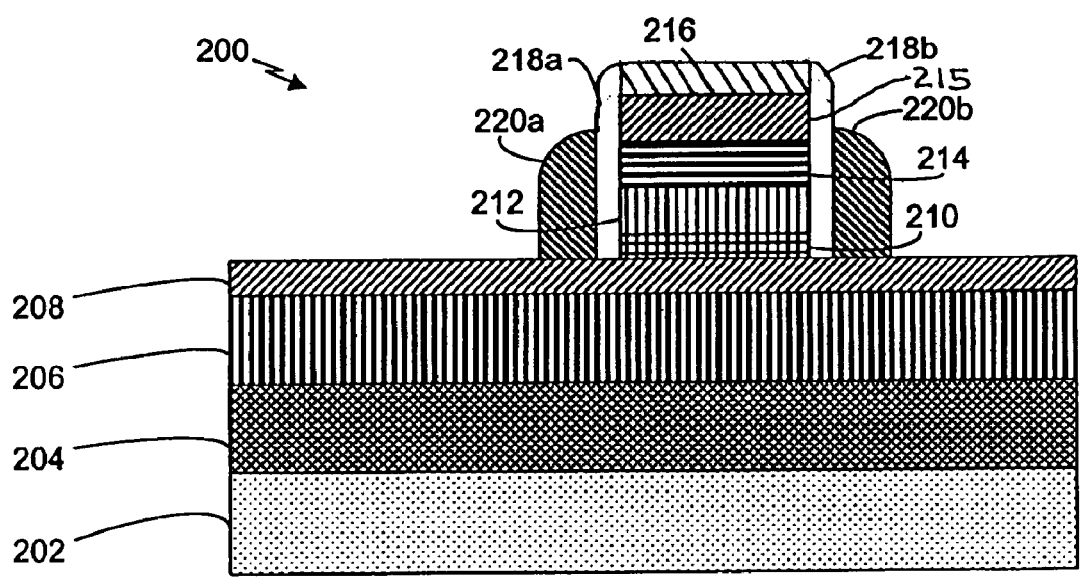
FIG. 2D is a diagrammatic cross-section of the exemplary semiconductor structure in FIG. 2C displaying a self-aligned base contact formed according to aspect of the present inventions.
Figure 2E:
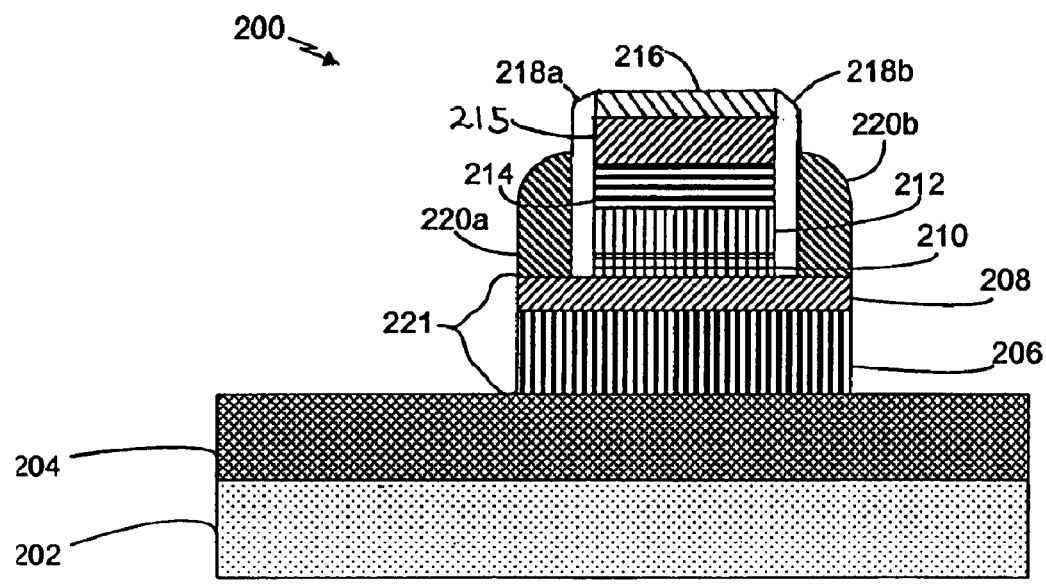
FIG. 2E is a diagrammatic cross-section of the exemplary semiconductor structure in FIG. 2D, displaying a self-aligned base mesa formed, subsequent to etching according to aspects of the present invention.
Figure 2F:
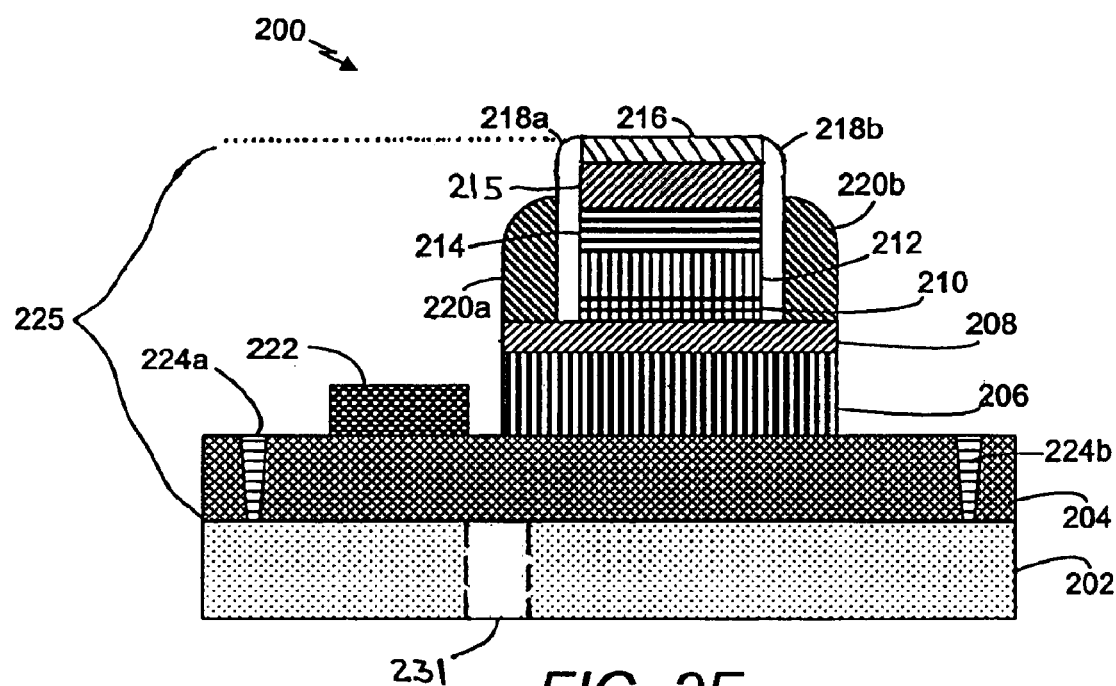
FIG. 2F is a diagrammatic cross-section of the exemplary semiconductor structure in FIG. 2E, displaying an emitter contact and electrical discontinuities formed according to aspects of the present invention.
Figure 3:
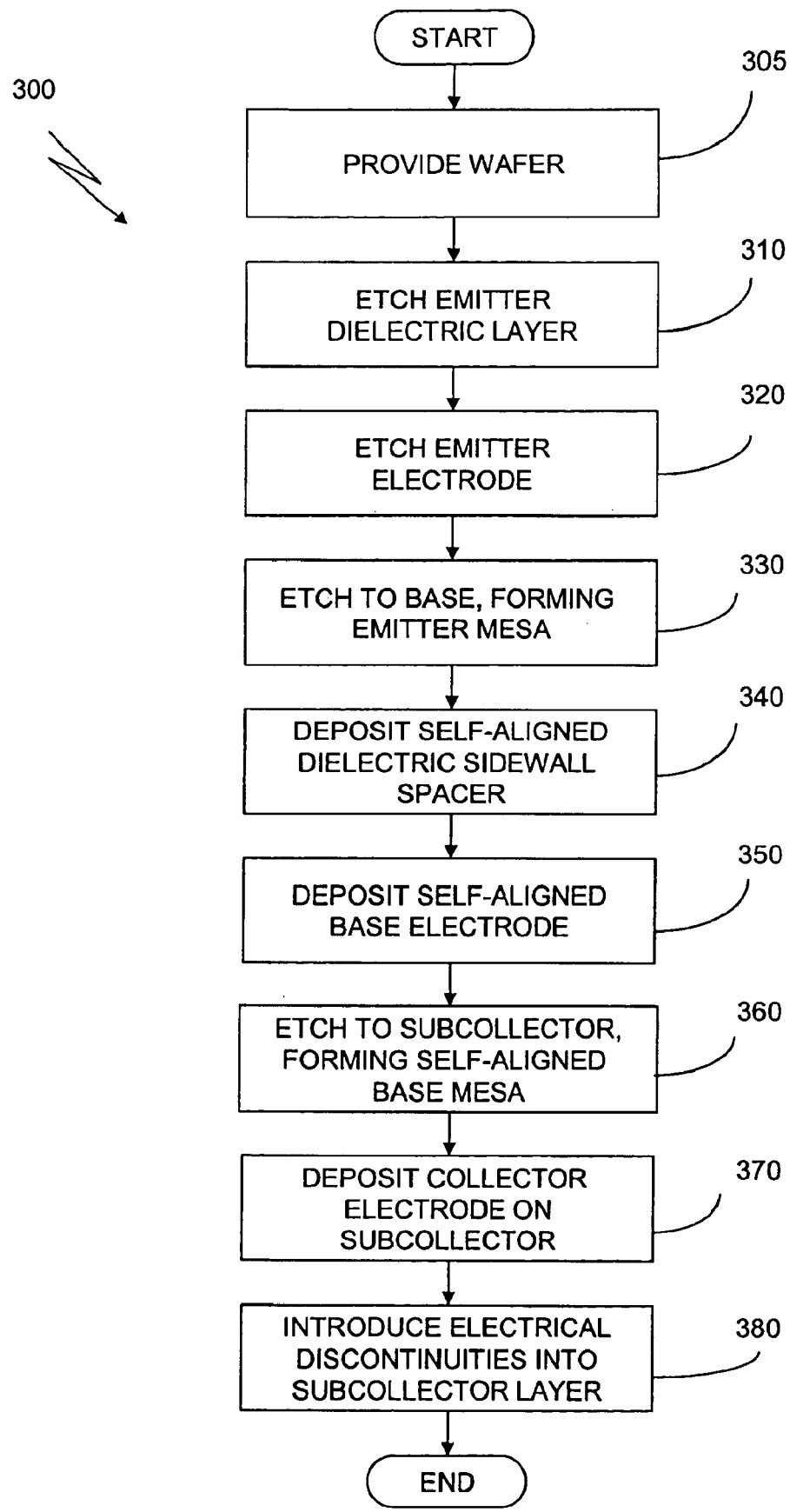
FIG. 3 is a process flow diagram illustrating a method used to fabricate the heterojunction bipolar transistor in FIGS. 2A–2F, in accordance with the present invention.

In conjunction with FIGS. 2B–2F, which illustrate the formation of structure 200, operations 305–380 of FIG. 3 illustrate overall process 300, which can be used in the aforementioned formation. Turning to FIG. 2B, the emitter area can be defined by high-resolution lithography, for example, electron beam, X-Ray or deep-UV lithography. The emitter dielectric layer 216 can be selectively etched away (FIG. 3, Operation 310), with emitter ohmic metal 215 being subsequently etched away (FIG. 3, Operation 320). The formation of emitter mesa 211 can begin with an anisotropic etch, such as a well-controlled wet etch or reactive ion dry etching, to a sufficient degree as to expose, but not invade, base layer 208 (FIG. 3, Operation 330). Although the formation of the emitter mesa by etching to base is described as multiple operations, in various embodiments the formation is a single operation.

As illustrated in FIG. 2C, self-aligned dielectric sidewall spacer 218a, 218b can be grown horizontally upon base layer 208, and vertically upon the sidewalls of emitter mesa 211, to a predetermined spacer thickness, using a dielectric material suitable to provide sufficient electrical isolation to emitter mesa 211. Exemplary dielectric materials can include, without limitation, silicon oxide, silicon nitride, silicon oxynitride, and functional combinations thereof (FIG. 3, Operation 340). It may be desirable that self-aligned dielectric sidewall 218a, 218b be formed using conformal deposition techniques, for example, a CVD-based deposition process. A dry etch can be used to remove unwanted dielectric from surface of structure 200 prior to the metallization process for deposition of base ohmic contact 220a, 220b. The lateral spacing between the base contact and the emitter edge affects the diffusion of minority carriers and, thus peak DC current gain, $\beta$. A narrow base-emitter contact spacing can result in reduced extrinsic base resistance, reduced base-collector junction capacitance, and improved performance characteristics. Therefore, relatively slight process variations in HBTs lacking self-aligned dielectric sidewall spacer 218a, 218b, can be deleterious both to manufacturing yield and to HBT performance. Thus, self-aligned dielectric sidewall spacer 218a, 218b, advantageously effects greater precision and control over base-emitter spacing, thereby increasing yield and device performance.

In FIG. 2D, base ohmic contact 220a, 220b is shown formed upon etch-exposed base layer 208, as well as self-aligned dielectric sidewall 218a, 218b, following the formation of sidewall spacer 218a, 218b upon emitter mesa 211 (FIG. 3, Operation 350). Base ohmic contact 220a, 220b can be composed of, for example, non-alloyed Ti/Pt/Au or other low-resistance materials suitable for forming an efficient electrical interface with the uppermost material of base layer 208, and also may be deposited using conformal deposition techniques, including CVD. In light of the present disclosure, it will be recognized by skilled artisans that base contact metal 220a, 220b itself can be a self-aligned metal sidewall spacer next to self-aligned dielectric sidewall 218a, 218b; and that self-aligned dielectric sidewall 218a, 218b serves to electrically isolate base ohmic contact 220a, 220b from emitter ohmic contact 215.

In FIG. 2E, base ohmic contact 220a, 220b is shown also to serve as an etch mask defining self-aligned base mesa 121, which can include base layer 208 and collector layer 206. Once base contact 220a, 220b is defined, structure 200 may be further etched to a sufficient degree as to expose, but not invade, subcollector layer 204, thereby forming base mesa 221 (FIG. 3, Operation 360). As in the previous deep etch, described relative to FIG. 1B, it may be desirable that the etch techniques employed be generally anisotropic in nature, such as a well-controlled wet etch or reactive ion dry etching. The self-aligning nature of base contact 220a, 220b provides sufficient masking in the predominant direction of etching, i.e., vertically downward relative to the surface of layer 208, to define base mesa 221 such that base layer 208 and collector layer 206 are also electrically and physically isolated by the etching process.

As illustrated in FIG. 2F, structure 200 is substantially electrically completed as a heterojunction bipolar transistor with the deposition of collector ohmic contact 222 upon subcollector layer 204 (FIG. 3, Operation 370). It may be desirable to fabricate collector ohmic contact 222, for example, from non-alloyed Ni/AuGe/Au, or other low-resistance materials suitable for forming an efficient electrical interface with the uppermost material of subcollector layer 204. Further, it can be desirable to electrically isolate HBT structure 200 from other semiconductor structures which also may be fabricated upon substrate 202, by introducing electrical discontinuities 224a, 224b into subcollector layer 204 (FIG. 3, Operation 380). In some embodiments a via 231 is used as a collector contact. The via 231 as illustrated is through the substrate 202 to the subcollector layer 204 of the collector. Discontinuities 224a, 224b can be introduced by inducing lattice damage to the region of subcollector layer 204 which surrounds structure 200 through ion-implantation, thereby making discontinuities 224a, 224b semi-insulating. However, this technique also can damage substrate 202, and ion-implantation technology may not be desirable to use for the structure under development. An alternate isolation procedure can be to create gap discontinuities 224a, 224b by etching epitaxial subcollector layer 204 around transistor structure 200 to form HBT mesa 225 on semi-insulating substrate 202. Also, etched gaps 224a, 224b at the edges of HBT mesa 225 can be filled with dielectric or planarizing materials, such as, for example, polyimide, to achieve a planar device. Moreover other forms of physical and electrical isolation may be employed, which substantially impede undesired electric flow between adjacent semiconductor structures. In addition, the semiconductor junction surfaces of the present invention can be protected by applying selected passivation layers during device fabrication, thereby improving device quality control. The transistor performance can be consistent with the bandwidth and edge rate requirements of circuits operating at 40–50 Gb/s.

Although the present invention can be described in the context of a self-aligned, emitter-up NPN heterojunction bipolar transistor structure, a skilled artisan would realize that this description is exemplary and that the invention is not so constrained, but can include PNP HBT, as well as collector-up configurations.

Many alterations and modifications may be made by those having ordinary skill in the art without departing from the spirit and scope of the invention. Therefore, it must be understood that the illustrated embodiments have been set forth only for the purposes of example, and that it should not be taken as limiting the invention as defined by the following claims. The following claims are, therefore, to be read to include not only the combination of elements which are literally set forth, but all equivalent elements for performing substantially the same function in substantially the same way to obtain substantially the same result. The claims are thus to be understood to include what is specifically illustrated and described above, what is conceptually equivalent, and also what incorporates the ideas of the invention.

What is claimed is:

1. A semiconductor structure, comprising:
   a collector, a base, and an emitter, operably coupled as a bipolar junction transistor;
   a dielectric sidewall spacer with a predetermined spacer thickness self-alignedly disposed on a side wall of the emitter;
   a base contact self-alignedly disposed upon the dielectric sidewall spacer and electrically coupled with the base;
   a self-aligned base mesa defined by the base contact; and
   a base metal contact pad on the base mesa, the base metal contact pad contacting the dielectric sidewall spacer.

2. The semiconductor structure of claim 1, wherein the collector, the emitter, and the base are comprised of materials from the Group III–V compound semiconductor group materials.

3. The semiconductor structure of claim 1, wherein the semiconductor structure comprises a heterojunction bipolar transistor having an InP/InGaAs heterojunction.

4. The semiconductor structure of claim 3, wherein the base is a InGaAs material and the emitter is an InP material.

5. The semiconductor structure of claim 4, wherein the base is carbon-doped.

6. A semiconductor structure, comprising:
   a collector, a base, and an emitter, operably coupled as a bipolar junction transistor;
   a dielectric sidewall spacer self-alignedly disposed on the emitter;
   a base contact self-alignedly disposed upon the dielectric sidewall spacer and electrically coupled with the base;
   a base mesa self-aligned relative to the base contact; and
   a base metal contact pad overlaying a portion of the emitter, the base metal contact pad electrically coupled with the base contact.

7. The semiconductor structure of claim 6 further comprising a substrate, the substrate underlying the collector, and a via extending through the substrate to a subcollector layer of the collector.

8. A semiconductor structure, comprising:
   a collector, a base, and an emitter, operably coupled as a bipolar junction transistor;
   a dielectric sidewall spacer with a predetermined spacer thickness self-alignedly disposed on a side wall of the emitter;
   a base contact self-alignedly disposed upon the dielectric sidewall spacer and electrically coupled with the base;
   a self-aligned base mesa defined by the base contact;
   a substrate, the substrate underlying the collector, and a via extending through the substrate to a subcollector layer of the collector.

9. A heterojunction bipolar transistor, comprising:
   a dielectric sidewall spacer with a predetermined spacer thickness self-alignedly disposed on a wall of an emitter;
   a base contact self-aligned relative to the dielectric sidewall spacer, the dielectric sidewall spacer providing a self-aligned predetermined base-to-emitter spacing;
   a self-aligned base mesa defined by the base contact; and
   a base metal contact pad on the base mesa, the base metal contact pad contacting the dielectric sidewall spacer.

10. A heterojunction bipolar transistor, comprising:
    a dielectric sidewall spacer self-alignedly disposed on a wall of an emitter;
    a base contact self-aligned relative to the dielectric sidewall spacer, the dielectric sidewall spacer providing a self-aligned base-to-emitter spacing;
    a base mesa self-aligned relative to the base contact; and
    a base metal contact pad overlaying a portion of the emitter, the base metal contact pad electrically coupled with the base contact.

11. A signal amplifier, comprising:
    a collector;
    a collector contact electrically coupled with the collector;
    an emitter being a Group III–V semiconductor material of a first conductivity type;

an emitter contact electrically coupled with the emitter; a base electrically coupled with the collector and the emitter, and being a Group III–V semiconductor material of a second conductivity type;

a self-aligned base contact electrically coupled with the base;

a self-aligned dielectric sidewall spacer with a predetermined spacer thickness disposed between the base contact and the emitter, wherein the base contact is self-aligned relative to the self-aligned dielectric sidewall spacer and a predetermined base-to-emitter spacing is provided thereby; and a self-aligned base mesa defined by the base contact; and a base metal contact pad on the base mesa, the base metal contact pad contacting the dielectric sidewall spacer.

12. The signal amplifier of claim 11, wherein the base comprises a p-type InGaAs material and the emitter comprises an n-type InP material.

13. The signal amplifier of claim 11, wherein the base comprises an n-type material and the emitter comprises an p-type material.

14. A signal amplifier, comprising:

a collector;

a collector contact electrically coupled with the collector;

an emitter being a Group III–V semiconductor material of a first conductivity type;

an emitter contact electrically coupled with the emitter; a base electrically coupled with the collector and the emitter, and being a Group III–V semiconductor material of a second conductivity type;

a base contact electrically coupled with the base;

a self-aligned dielectric sidewall spacer disposed between the base contact and the emitter, wherein the base contact is self-aligned relative to the self-aligned dielectric sidewall spacer and a predetermined base-to-emitter spacing is provided thereby; and a self-aligned base mesa being aligned relative to the self-aligned base contact; and a base metal contact pad overlaying a portion of the emitter, the base metal contact pad electrically coupled with the base contact.

15. A heterojunction bipolar transistor comprising:

a base contact self-alignedly disposed upon and electrically coupled with a base;

a dielectric sidewall spacer with a predetermined spacer thickness self-alignedly disposed between the base contact and an emitter;

a self-aligned base mesa defined by the self-aligned base contact; and a base metal contact pad on the base mesa, the base metal contact pad contacting the dielectric sidewall spacer.

16. The heterojunction bipolar transistor of claim 15 including:

a p-type InGaAs material in the base; and an n-type InP material in the emitter.

17. A transistor comprising:

a collector;

a base overlaying at least a portion of the collector;

an emitter overlying at least a portion of the base;

a base metal contact pad overlaying at least part of a portion of the emitter, the base metal contact pad electrically coupled to the base by a base ohmic contact, the base ohmic contact being a self-aligned base contact sidewall spacer; and a self-aligned base mesa defined by the base contact sidewall spacer.

18. A transistor comprising:

a collector;

a base overlaying at least a portion of the collector;

an emitter overlying at least a portion of the base;

a base metal contact pad overlaying at least part of a portion of the emitter, the base metal contact pad electrically coupled to the base by a base contact sidewall; and a dielectric sidewall spacer, the dielectric sidewall spacer being between the base contact sidewall and the emitter.

19. The transistor of claim 18 further comprising an emitter oxide, the emitter oxide being between the base metal contact pad and the emitter.

* * * * *